(12) United States Patent
Wen et al.

(10) Patent No.: US 6,966,041 B2
(45) Date of Patent: Nov. 15, 2005

(54) CHIP FABRICATION PROCEDURE AND SIMULATION METHOD FOR CHIP TESTING WITH PERFORMANCE PRE-TESTING

(75) Inventors: FuChu Wen, Taipei (TW); Tony Han, Taipei (TW); Chin-Fa Hsiao, Taipei (TW)

(73) Assignee: Via Technologies, Inc., Taipei (TW)

( * ) Notice: Subject to any disclaimer, the term of this patent is extended or adjusted under 35 U.S.C. 154(b) by 175 days.

(21) Appl. No.: 10/216,379

(22) Filed: Aug. 12, 2002

(65) Prior Publication Data

US 2003/0208722 A1 Nov. 6, 2003

(30) Foreign Application Priority Data

May 1, 2002 (TW) ............................... 91109051 A

(51) Int. Cl.⁷ ............................................. G06F 17/50
(52) U.S. Cl. ................... 716/4; 716/1; 716/2; 703/13; 703/23
(58) Field of Search ......... 716/1–6, 18–21; 703/13–23

(56) References Cited

U.S. PATENT DOCUMENTS

| | | | | |
|---|---|---|---|---|
| 4,769,817 A | * | 9/1988 | Krohn et al. | 714/33 |
| 4,791,578 A | * | 12/1988 | Fazio et al. | 716/4 |
| 4,937,770 A | * | 6/1990 | Samuels et al. | 703/16 |
| 5,838,948 A | * | 11/1998 | Bunza | 703/27 |
| 5,923,836 A | * | 7/1999 | Barch et al. | 714/33 |
| 6,233,182 B1 | * | 5/2001 | Satou et al. | 365/200 |
| 6,363,509 B1 | * | 3/2002 | Parulkar et al. | 714/738 |
| 6,446,243 B1 | * | 9/2002 | Huang et al. | 716/7 |
| 6,467,056 B1 | * | 10/2002 | Satou et al. | 714/720 |
| 6,560,571 B1 | * | 5/2003 | McBride | 703/14 |
| 6,606,734 B2 | * | 8/2003 | Greaves | 716/4 |
| 6,708,319 B2 | * | 3/2004 | Adachi et al. | 716/5 |
| 6,718,523 B2 | * | 4/2004 | Hathaway et al. | 716/4 |
| 2002/0040288 A1 | * | 4/2002 | Yamoto et al. | 703/17 |
| 2002/0093356 A1 | * | 7/2002 | Williams et al. | 324/765 |
| 2002/0133325 A1 | * | 9/2002 | Hoare et al. | 703/17 |
| 2003/0061580 A1 | * | 3/2003 | Greaves | 716/4 |

* cited by examiner

*Primary Examiner*—Leigh M. Garbowski
(74) *Attorney, Agent, or Firm*—Rosenberg, Klein & Lee

(57) ABSTRACT

The present invention discloses a chip fabrication procedure as well as a simulation method for chip testing with performance pre-testing. The chip fabrication procedure with performance pre-testing comprising steps of: providing a chip design; determining if the chip design is correct by using a simulation environment; determining if the chip performance meets the standards by using a performance testing process; and proceeding with production of chips. The simulation method for chip testing comprises steps of: providing a simulation environment corresponding to a chip design; providing at least one set of testing commands; executing the testing commands; and calculating the time required for completing executing the testing commands. The present invention is advantageous since the time requited for product testing is reduced and so is the fabrication cost.

13 Claims, 4 Drawing Sheets

CHIP FABRICATION PROCEDURE AND SIMULATION METHOD FOR CHIP TESTING WITH PERFORMANCE PRE-TESTING

BACKGROUND OF THE INVENTION

1. Field of the Invention

The present invention generally relates to a chip fabrication procedure and, more particularly, to a chip fabrication procedure as well as a simulation method for chip testing with performance pre-testing, in which the chip is produced after a simulation on design validity and product performance is carried out so as to confirm the product advantage, such that the time requited for product testing is reduced and so is the fabrication cost.

2. Description of the Prior Art

In recent years, with the high development in electronic- and information-related industries, people have increasing needs for better performance of various electronic and information products. In view of this, the industries have made lots of efforts to develop various new products. These new products may, however, cooperate with different specifications from the conventional ones. It is inevitable that the new products with various specifications must be tested before they can be presented to the public. Therefore, product testing has become an important issue for the manufacturers.

For some chip design houses and chip manufacturers, the conventional procedure including steps from design to testing is as shown in FIG. 1. First of all, a chip design is provided (step 101). Secondly, simulation is performed on the chip design so as to test if the design responds correctly with respect to various testing commands (step 103). The procedure then proceeds with production of chips (step 105). Next, a motherboard corresponding to the designed chip is prepared (step 107). Later, a computer comprising the chip is assembled (step 109). An operating system (OS) as well as software for performance testing is installed (step 111). At last, chip performance is tested and analyzed (step 113) to determine if the performance meets the standards. The chip can be presented to the public only if the performance meets the standards; otherwise, the chip should be re-designed and/or modified.

In general, the probability of mal-functionality of a chip could be reduced with the simulation step 103. However, the fore-mentioned procedure does not guarantee that the thus produced chip has expected performance. The chip performance could be known only after the subsequent steps 109, 111, and 113. It may take a relatively long time. Moreover, if the performance fails to meet the standards after being tested, the cost as well as the efforts according to the fabrication procedure would be in vain. As a result, the thus increased cost will make the product less competitive in the market.

Therefore, there is need in providing a chip fabrication procedure as well as a simulation method for chip testing with performance pre-testing, in which the chip is produced after a simulation on design validity and product performance is carried out so as to confirm and the product advantage, such that the time requited for product testing is reduced and so is the fabrication cost.

SUMMARY OF THE INVENTION

Accordingly, it is the primary object of the present invention to provide a chip fabrication procedure with perfor- mance pre-testing, in which the chip is produced after a simulation on design validity and product performance is carried out so as to confirm the product advantage.

It is a secondary object of the present invention to provide a chip fabrication procedure with performance pre-testing, in which the simulation is carried out in a software-based simulation environment so as to prevent the waste of raw materials.

It is another object of the present invention to provide a simulation method for chip testing with performance pre-testing, in which a simulation environment and at least one set of testing commands are employed to calculate the time required for completing executing the testing commands and evaluate the chip performance.

It is still another object of the present invention to provide a simulation method for chip testing with performance pre-testing, in which, with respect to a certain function, the time at which a first command is transmitted and the time at which a last command is completed are recorded so as to compare with various different versions of chip designs.

In order to achieve the foregoing objects, the present invention provides a chip fabrication procedure with performance pre-testing, comprising steps of: providing a chip design; determining if the chip design is correct by using a simulation environment; determining if the chip performance meets the standards by using a performance testing process; and proceeding with production of chips.

The present invention further provides a simulation method for chip testing, comprising steps of: providing a simulation environment corresponding to a chip design; providing at least one set of testing commands; executing the testing commands; and calculating the time required for completing executing the testing commands.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a chip fabrication procedure as well as a simulation method for chip testing with performance pre-testing can be exemplified by the preferred embodiment as described hereinafter.

Figure 1:
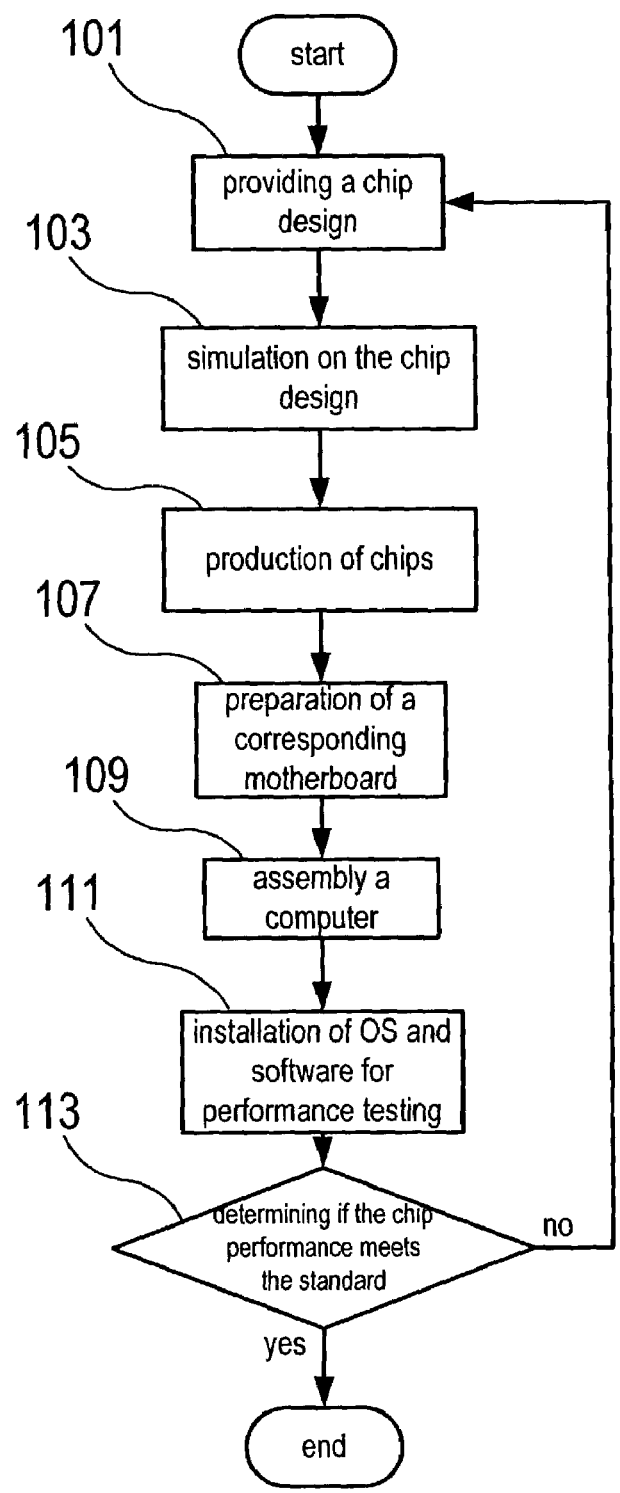
FIG. 1 is a flow chart showing a conventional chip fabrication procedure including chip testing in accordance with the prior art.
Figure 2:
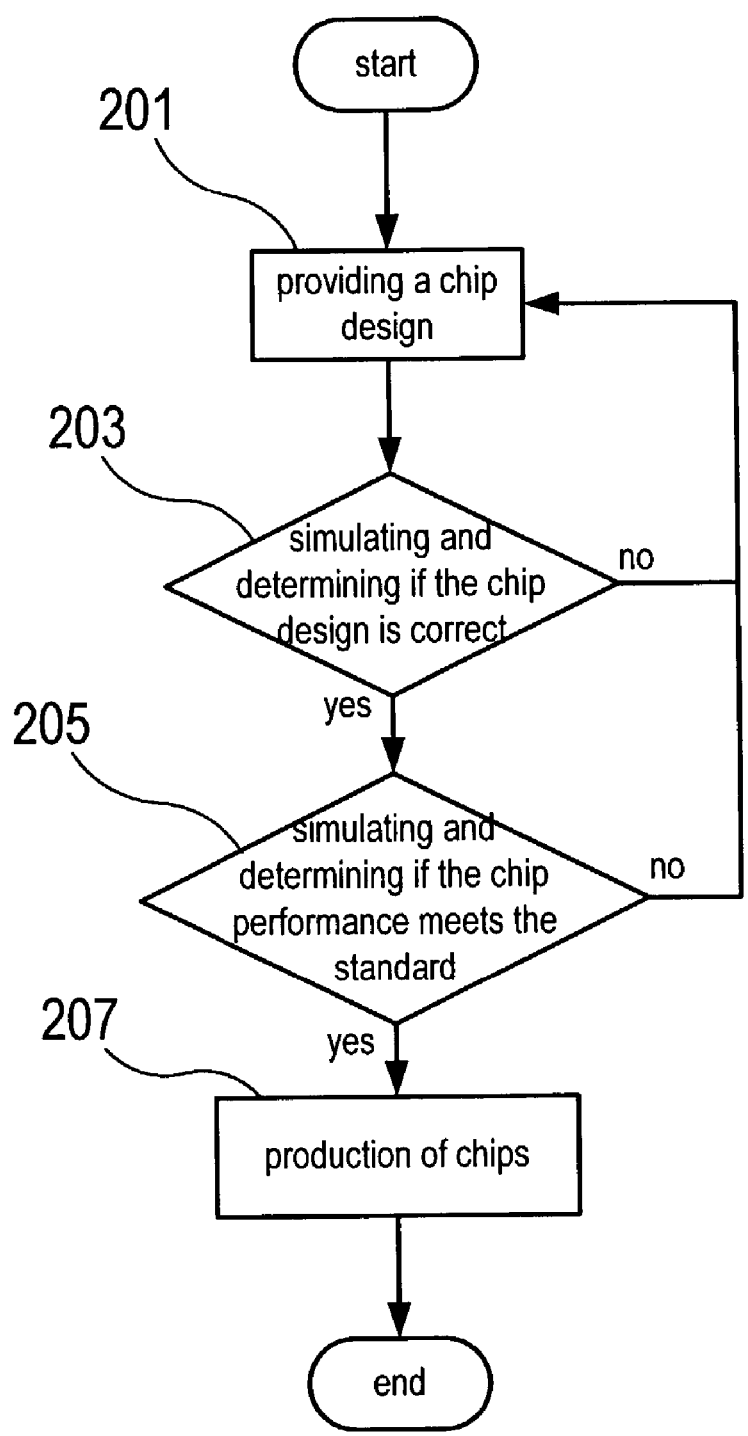
FIG. 2 is a flow chart showing a chip fabrication procedure in accordance with one preferred embodiment of the present invention.

First of all, please refer to FIG. 2, which is a flow chart showing a chip fabrication procedure in accordance with one preferred embodiment of the present invention. As shown in the figure, the procedure begins with step 201, in which a chip design is provided. The chip design is tested in a simulation environment, and whether the chip design responds correctly to various testing commands is determined (step 203). If the chip design does not respond correctly to the testing commands, the procedure returns to step 201 for modifying the chip design. On the contrary, if the chip design responds correctly to the testing commands, the procedure proceeds with step 205, in which the performance of the chip design is examined to determine if the performance meets the pre-determined standards. The procedure goes back to step 201 for modifying the chip design if the tested result fails to meet the standards; the procedure continues to step 207 for mass production of the chips according to the chip design, otherwise. In this manner, the design validity as well as the chip performance is examined before the chips are fabricated, therefore the probability of mal-functionality of the chips is minimized, so that the time required for product testing is reduced and so is the waste of raw materials.

Figure 3:
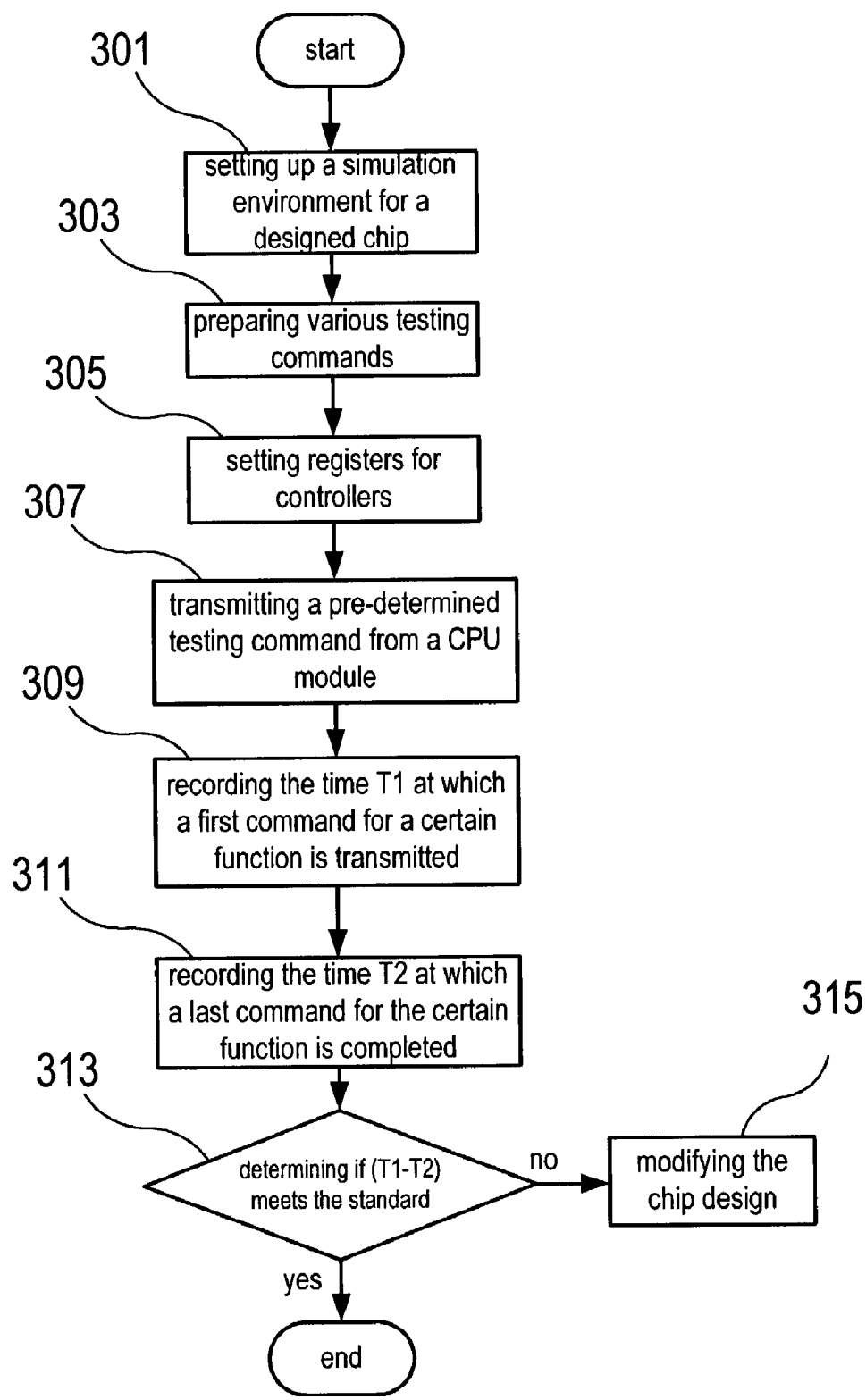
FIG. 3 is a flow chart showing a simulation method for chip testing in accordance with one preferred embodiment of the present invention.

Secondly, please refer to FIG. 3, which is a flow chart showing a simulation method for chip testing in accordance with one preferred embodiment of the present invention. As shown in the figure, the method starts with step 301, in which a simulation environment for a designed chip is established. Then, at least one set of testing commands for various conditions are prepared (step 303). After the simulation environment and the testing commands are provided, the registers in the simulation environment are filled with suitable pre-set values (step 305). Later, the prepared testing commands are transmitted from the CPU module (step 307). The time required for completing executing the testing commands is recorded so as to obtain the difference between the performances of various chip designs.

Furthermore, the simulation method for chip testing can also be used to test the performance according to a certain function. In step 309, the time T1 at which a first command for a certain function is transmitted is recorded. Then, in step 311, the time T2 at which a last command for that certain function is completed is recorded. The time (T2−T1) is calculated and then examined if it meets the pre-determined standard (step 313). The method goes to step 315 for modifying the chip design if the time (T2−T1) fails to meet the standard; otherwise, the method proceeds with mass production of the chips.

Figure 4:
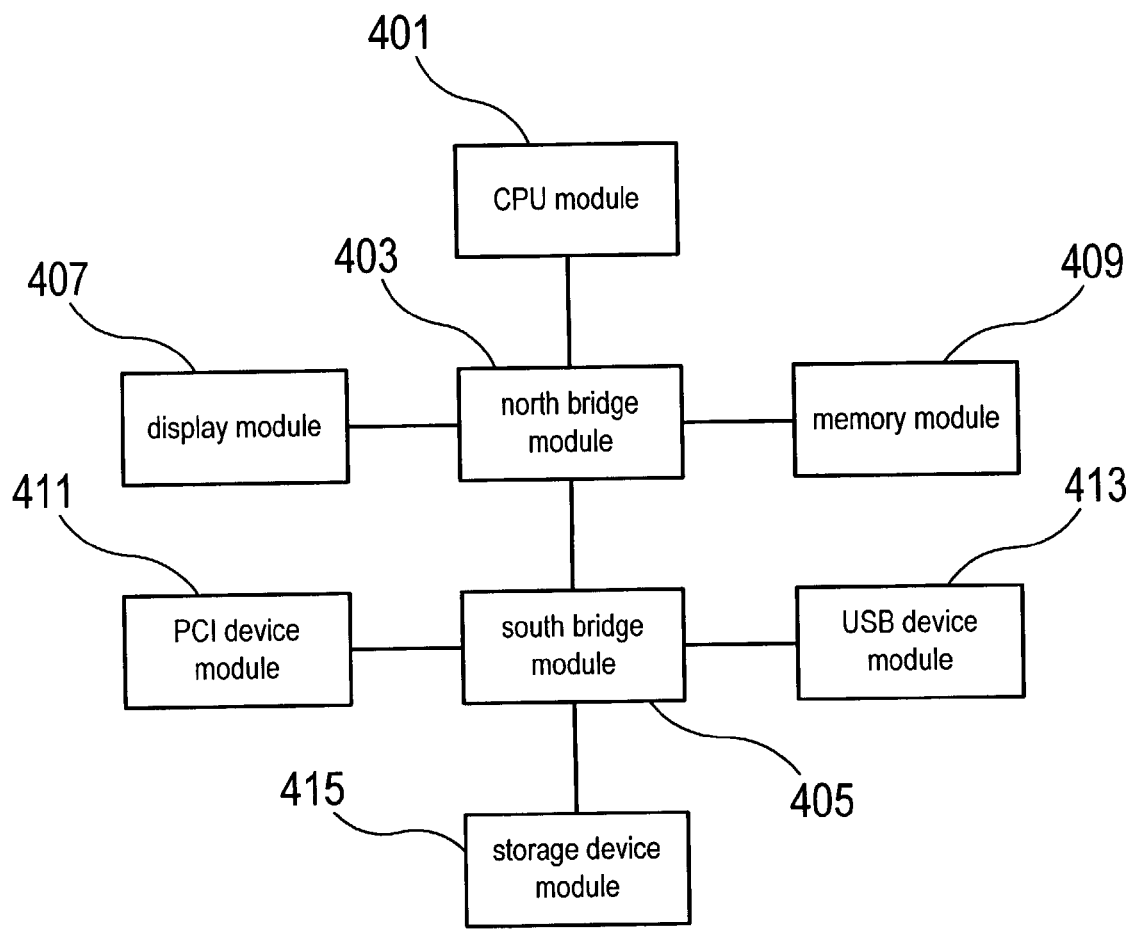
FIG. 4 is a block diagram schematically illustrating a simulation environment for chip performance testing in accordance with one preferred embodiment of the present invention.

At last, please refer to FIG. 4, which is a block diagram schematically illustrating a simulation environment for chip performance testing in accordance with one preferred embodiment of the present invention. As shown in FIG. 4, the simulation environment comprises: a CPU (central process unit) module 401, for functioning as a CPU in a computer; a host controller module, for controlling a host controller chip (such as one composed of a north bridge chip and a south bridge chip), where the host controller module can be implemented by using a north bridge module 403 and a south bridge module 405; and at least one of a memory module 409, a display module 407, other peripheral devices such as a storage device module 415, a PCI device module 411 and a USB device module 413, and combination thereof. FIG. 4 also shows the arrangement of these devices. More particularly, the CPU module 401 is connected to the north bridge module 403, which is connected to the display module 407, the south bridge module 405 and the memory module 409. The south bridge module 405 is further connected to various peripheral devices such as the PCI device module 411, the storage device module 415 and the USB device module 413.

When the performance of a new south bridge chip design is to be tested, at least one set of testing commands have to be prepared after the simulation environment is provided. The testing commands include commands for accessing hard disks, commands for accessing USB devices, and commands for accessing PCI devices. These commands are transmitted from the CPU module so as to calculate the time required for completing executing all the commands. Therefore, the performance of a chip designed is obtained. An additional chip design can be tested by using the same simulation environment such that the difference between various chip designs can be known.

Furthermore, in order to examine the performance of the IDE controller according to the chip design, we refer to recording the time at which a first command for accessing the hard disk is transmitted and also the time at which a last command for accessing the hard disk is completed. Therefore, the standard for evaluating the IDE controller is obtained. The time for different IDE controllers is then compared so as to obtain the extent to which various chip designs can improve the performance.

According to the above discussion, it is apparent that the present invention discloses a chip fabrication procedure as well as a simulation method for chip testing with performance pre-testing, in which the chip is produced after a simulation on design validity and product performance is carried out so as to confirm and the product advantage, such that the time requited for product testing is reduced and so is the fabrication cost. Therefore, the present invention has been examined to be progressive, advantageous and applicable to the industry.

Although this invention has been disclosed and illustrated with reference to a particular embodiment, the principles involved are susceptible for use in numerous other embodiments that will be apparent to persons skilled in the art. This invention is, therefore, to be limited only as indicated by the scope of the appended claims.

What is claimed is:

1. A chip fabrication procedure with performance pre-testing, comprising steps of:
   providing a design of a chip;
   executing a set of design testing commands using a simulation environment to determine if said design of said chip is correct;
   applying a performance testing process to said design of said chip to determine in software if performance of said chip meets operational standards, executing a plurality of performance testing commands for each of a plurality of functions, said performance testing process being operable to monitor timing information corresponding to the execution of said performance testing commands, wherein said performance testing process comprises the steps of:
   a. recording a time at which a first command of said plurality of performance testing commands for a respective one of said plurality of functions is transmitted, b. recording a time at which a last command of said plurality of performance testing commands for said respective function is completed and determining whether a difference between said recorded times meet a required standard;

c. repeating steps a. and b. for each of said plurality of functions;

d. calculating a time for completing all of said plurality of performance testing commands for all of said functions and recording said calculated time; and e. comparing said recorded calculated time with a recorded calculated time of another design of a chip similarly tested to evaluate performance; and, proceeding with production of chips.

2. The chip fabrication procedure as claimed in claim 1, wherein said simulation environment is a software-based simulation environment.

3. The chip fabrication procedure as claimed in claim 2, wherein said software-based simulation environment comprises a CPU module, a host controller module, and a memory module.

4. The chip fabrication procedure as claimed in claim 3, wherein said software-based simulation environment further comprises a storage device module.

5. The chip fabrication procedure as claimed in claim 3, wherein said host controller module comprises a north bridge module and a south bridge module.

6. The chip fabrication procedure as claimed in claim 3, wherein said software-based simulation environment further comprises at least one of a display module, a PCI device module, a device USB, other peripheral devices and combination thereof.

7. A simulation method for chip testing, comprising the steps of:

providing a simulation environment corresponding to a chip design;

providing at least one set of design testing commands;

executing said set of design testing commands for checking said chip design;

executing a plurality of performance testing commands for each of a plurality of functions of said chip design; and, calculating the time required for completing execution of said plurality of performance testing commands for each of said plurality of functions, said performance testing comprising the steps of;

a. recording a time at which a first command of said plurality of performance testing commands for a respective one of said plurality of functions is transmitted, b. recording a time at which a last command of said plurality of performance testing commands for said respective function is completed and determining whether a difference between said recorded times meet a required standard;

c. repeating steps a, and b, for each of said plurality of functions;

d. calculating a time for completing all of said plurality of performance testing commands for all of said functions and recording said calculated time; and e. comparing said recorded calculated time with a recorded calculated time of another design of a chip similarly tested to evaluate performance.

8. The simulation method for chip testing as claimed in claim 7, wherein said simulation environment is a software-based simulation environment.

9. The simulation method for chip testing as claimed in claim 8, wherein said software-based simulation environment comprises a CPU module, a host controller module, and a memory module.

10. The simulation method for chip testing as claimed in claim 9, wherein said software-based simulation environment further comprises a storage device module.

11. The simulation method for chip testing as claimed in claim 9, wherein said host controller module comprises a north bridge module and a south bridge module.

12. The simulation method for chip testing as claimed in claim 9, wherein said software-based simulation environment further comprises at least one of a display module, a PCI device module, a device USB, other peripheral devices and combination thereof.

13. The simulation method for chip testing as claimed in claim 7, further comprising steps of:

providing a second chip design that provides the same functions as said chip design;

executing said set of testing commands on said second chip design;

executing said plurality of performance testing commands for each of said plurality of functions on said second chip design; and calculating a time required for completing execution of all of said plurality of performance testing commands for all of said functions on said second chip design; and comparing said calculated time for said chip design with said calculated time for said second chip design.

* * * * *